(12) United States Patent
Posamentier

(10) Patent No.: US 7,409,197 B2
(45) Date of Patent: Aug. 5, 2008

(54) TRANSCEIVER WITH RECEIVE PATH OVERLOAD PROTECTION AND METHOD

(75) Inventor: Joshua Posamentier, Oakland, CA (US)

(73) Assignee: Intel Corporation, Santa Clara, CA (US)

( * ) Notice: Subject to any disclaimer, the term of this patent is extended or adjusted under 35 U.S.C. 154(b) by 481 days.

(21) Appl. No.: 11/096,195

(22) Filed: Mar. 31, 2005

(65) Prior Publication Data

US 2006/0223451 A1     Oct. 5, 2006

(51) Int. Cl.
H04B 1/18    (2006.01)
H04B 1/06    (2006.01)
H04B 1/16    (2006.01)

(52) U.S. Cl. .............. 455/193.1; 455/249.1; 455/250.1; 455/340

(58) Field of Classification Search .............. 455/193.1, 455/193.3, 249.1, 250.1, 340
See application file for complete search history.

(56) References Cited

U.S. PATENT DOCUMENTS

| | | | | |
|---|---|---|---|---|
| 3,600,706 A | * | 8/1971 | Ritchie | 331/177 V |
| 3,646,463 A | * | 2/1972 | Rutulis et al. | 330/4.9 |
| 3,896,403 A | * | 7/1975 | Ma | 334/15 |
| 3,983,490 A | * | 9/1976 | Ma | 455/195.1 |
| 4,158,814 A | | 6/1979 | Imazeki et al. | |
| 4,193,077 A | * | 3/1980 | Greenberg et al. | 343/747 |
| 5,541,833 A | * | 7/1996 | Bristol et al. | 700/45 |
| 6,091,942 A | | 7/2000 | Buer et al. | |
| 6,574,454 B1 | * | 6/2003 | Tuttle | 455/41.1 |
| 6,989,750 B2 | * | 1/2006 | Shanks et al. | 340/572.4 |
| 7,228,119 B2 | * | 6/2007 | Galan | 455/260 |
| 2002/0118042 A1 | * | 8/2002 | Helt et al. | 326/86 |
| 2003/0062968 A1 | * | 4/2003 | Watanabe | 333/81 R |
| 2003/0176202 A1 | * | 9/2003 | Bartl et al. | 455/522 |
| 2004/0127181 A1 | | 7/2004 | Galan | |
| 2004/0174155 A1 | * | 9/2004 | Anderson et al. | 324/76.11 |
| 2005/0184922 A1 | * | 8/2005 | Ida et al. | 343/861 |
| 2006/0174177 A1 | * | 8/2006 | Weinstein et al. | 714/742 |

FOREIGN PATENT DOCUMENTS

| | | |
|---|---|---|
| JP | 59135915 A2 | 8/1984 |
| WO | WO-00/38318 A1 | 6/2000 |
| WO | WO-2004/082134 A1 | 9/2004 |

OTHER PUBLICATIONS

"International Search Report for corresponding PCT Application No. PCT/US2006/012145", (Aug. 9, 2006), 4 pgs.

* cited by examiner

*Primary Examiner*—Duc M. Nguyen
(74) *Attorney, Agent, or Firm*—Schwegman, Lundberg & Woessner, P.A.; Gregory J. Gorrie

(57) ABSTRACT

A transceiver includes a detuning circuit to generate an impedance mismatch in a receive signal path in response to a control signal provided by loop-control circuitry. The loop-control circuitry generates the control signal based on a comparison of detected peak signal levels in the receive signal path. In this way, high-power input signal levels in the receive signal path may be reflected back to an input of the receiver due to the impedance mismatch.

21 Claims, 3 Drawing Sheets

TRANSCEIVER WITH RECEIVE PATH OVERLOAD PROTECTION AND METHOD

TECHNICAL FIELD

Some embodiments of the present invention pertain to receivers and transceivers. Some embodiments pertain to radio-frequency identification (RFID) tag readers. Some embodiments pertain to wireless and mobile communication device transceivers including transceivers for third-generation cellular handsets.

BACKGROUND

Receivers for certain applications may need to have a large dynamic range requiring a very sensitive receive signal path. These receivers should be able to operate in the presence high-level in-band signals without damage to the circuitry. Some conventional techniques employed by receivers to protect sensitive circuitry in the RF receive path include fused or breaker circuits to decouple the sensitive circuitry when a high-level in-band signal is received. These techniques, however, do not allow the receiver to continue to operate during these conditions and sometimes require replacement of the fuse or resetting of a breaker. Some other conventional techniques include the use of low-noise amplifiers (LNAs) with low-compression points; however these LNAs generally consume more bias current and may be less desirable for portable and battery-powered devices. Thus there are general needs for protecting a receiver's front end from high-level in-band signals.

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. Embodiments of the invention set forth in the claims encompass all available equivalents of those claims. Embodiments of the invention may be referred to, individually or collectively, herein by the term "invention" merely for convenience and without intending to limit the scope of this application to any single invention or inventive concept if more than one is in fact disclosed.

Figure 1:
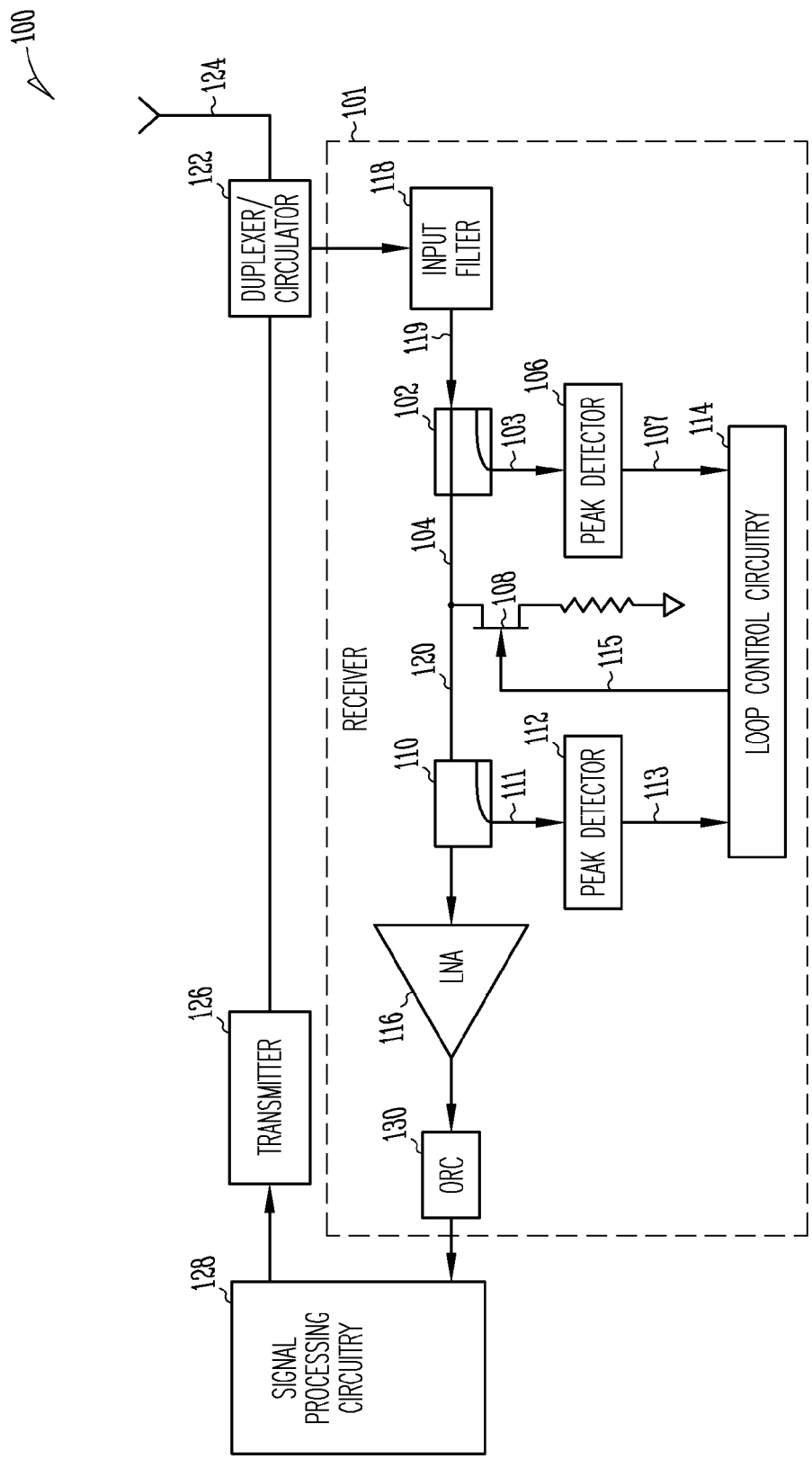
FIG. 1 is a block diagram of a transceiver in accordance with some embodiments of the present invention.

FIG. 1 is a block diagram of a transceiver in accordance with some embodiments of the present invention. Transceiver 100 comprises receiver 101 for receiving radio-frequency (RF) signals, transmitter 126 for transmitting RF signals, and signal processing circuitry 128 coupling receiver 101 and transmitter 126. Receiver 101 provides received signals to signal processing circuitry 128 and signal processing circuitry 128 provides signals to transmitter 126 for transmission. Transceiver 100 may be part of almost any wireless communication device. In some embodiments, transceiver 100 may be a wireless local area network (WLAN) transceiver (e.g., a WiFi transceiver), a wireless metropolitan area network (WMAN) transceiver (e.g., a WiMax transceiver), an ultra-wide band (UWB) transceiver or a transceiver in a mobile handset, such as a third-generation (3G) cellular handset, although the scope of the invention is not limited in this respect. In some embodiments, transceiver 100 may be part of a radio-frequency identification (RFID) tag reader, although the scope of the invention is not limited in this respect. These embodiments are discussed in more detail below.

In accordance with some embodiments of the present invention, receiver 101 comprises detuning circuit 108 to degrade signals in receive signal path 104 in response to control signal 115, and loop-control circuitry 114 to generate control signal 115 by a comparison of detected peak signal levels in receive signal path 104. In some embodiments, detuning circuit 108 may generate an impedance mismatch in receive signal path 104 in response to control signal 115. High-power input signal levels in receive signal path 104 may be reflected back to the input of receiver 101 due to the impedance mismatch generated by detuning circuit 108. Detuning circuit 108 and loop-control circuitry 114 may allow receiver 101 to operate and receive desired signals even when high-power level in-band signals are received.

These high-power signals may result from signals received through antenna 124 from an external source, such a cellular transmitter or another wireless communication device. In some situations, these high-power level in-band signals may also be reflected by antenna 124 after being generated by transmitter 126. For example, in some RFID tag reader embodiments, if a large metallic object passes in front of the transmit antenna when transmitting high-power levels (e.g., around a Watt), large amounts of RF energy may be reflected back through the receive antenna which may damage the receiver's circuitry if it were not for the operations described herein.

In some embodiments, receiver 101 also comprises initial peak detector 106 to provide input signal level output 107 to loop-control circuitry 114. Input signal level output 107 may be proportional to a peak level of input signal 119. Receiver 101 may also comprise feedback peak detector 112 to provide output signal level output 113 to loop-control circuitry 114. Output signal level output 113 may be proportional to a peak level of output signal 120. In these embodiments, loop-control circuitry 114 may compare input signal level output 107, output signal level output 113 and a desired output signal level, and may responsively provide control signal 115 to detuning circuit 108 based on the comparison to maintain output signal 120 below a predetermined peak signal level.

In some embodiments, receiver 101 may also comprise power tap 102 in receive signal path 104 before detuning circuit 108 to provide coupled signal 103 to initial peak detector 106. Coupled signal 103 may be proportional to input signal 119. Receiver 101 may also comprise power tap 110 in receive signal path 104 after detuning circuit 108 to provide coupled signal 111 to peak detector 112. Coupled signal 111 may be proportional to output signal 120.

In some embodiments, loop-control circuitry 114 may comprise a proportional-integral-derivative (PID) controller employing a PID control loop, although the scope of the invention is not limited in this respect. The use of a PID control loop may allow the time to convergence as well as the settling time to be adaptively tuned for the physical system. In some of these embodiments, by being able to change the loop's differential and integral terms independently, the timing behavior of the control loop may be optimized for maximum system performance without unnecessarily reducing the power level of signal 120.

In some embodiments, the desired output signal level may be a setpoint of a PID controller, although the scope of the invention is not limited in this respect. In some embodiments, loop-control circuitry 114 may comprise analog circuitry, while in other embodiments; loop-control circuitry 114 may comprise digital circuitry.

In some embodiments, detuning circuit 108 may comprise any device in receive signal path 104 that creates a change in the impedance in response to a control signal. In some embodiments, detuning circuit 108 may comprise a field-effect transistor (FET) and control signal 115 may comprise a gate voltage. In these embodiments, the FET may generate a low-input impedance in receive signal path 104 which may reflect a significant portion of the input signal back toward the input of receiver 101. In some embodiments, detuning circuit 108 may comprise one or more pseudomorphic high-electron mobility transistors (PHEMTs), including Gallium Arsenide (GaAs) PHEMTs, or one or more PIN diodes, although the scope of the invention is not limited in this respect.

Figure 2:
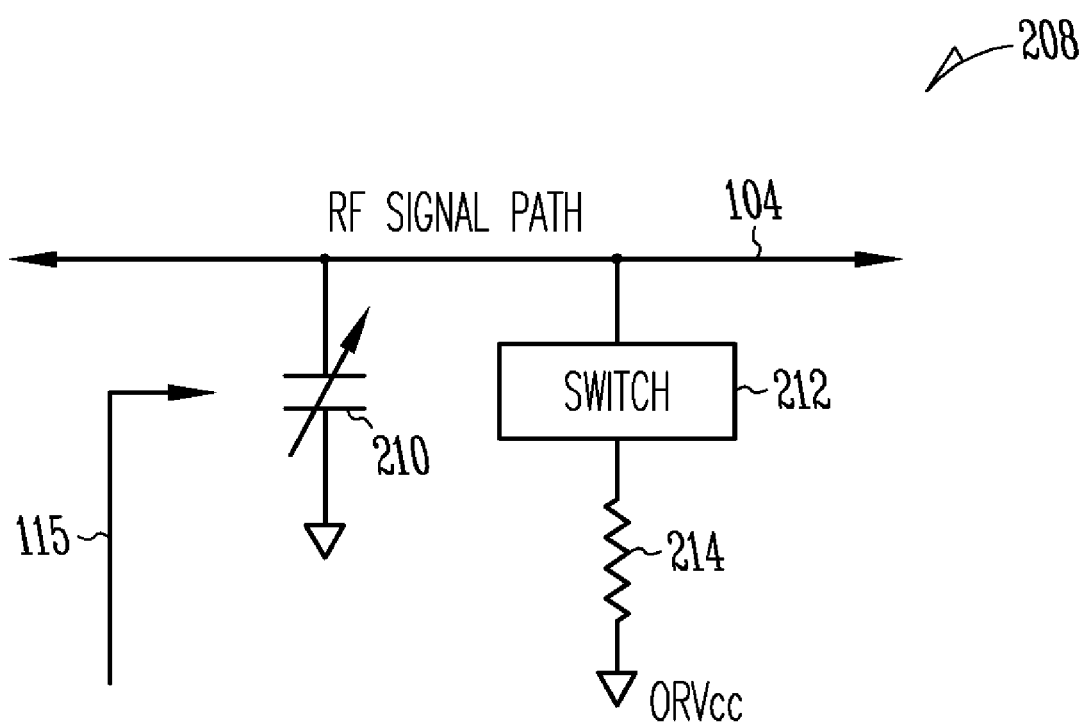
FIG. 2 is a circuit diagram of a detuning circuit in accordance with some alternate embodiments of the present invention.

FIG. 2 is a circuit diagram of a detuning circuit in accordance with some alternate embodiments of the present invention. Detuning circuit 208 may be suitable for use as detuning circuit 108 (FIG. 1), although the scope of the invention is not limited in this respect as other detuning circuits may also be suitable. In these embodiments, detuning circuit 208 may comprise one or more varactors 210 responsive to the control signal 115 (FIG. 1) to generate an impedance mismatch. Varactors 210 may comprise variable diodes and/or voltage controlled capacitors. In some embodiments, detuning circuit 208 may also comprise one or more shunt resistors 214, and switching circuitry 212 responsive to control signal 115 to switch the one or more shunt resistors into receive signal path 104. The one or more shunt resistors 214 may attenuate high-level input signals when input signal level output 107 (FIG. 1) exceeds a predetermined level. In some embodiments, the greater the input signal level, the greater number of shunt resistors 214 that may be switched in. In some embodiments, PIN diode switches may be used for the switch 212, although the scope of the invention is not limited in this respect.

Referring back to FIG. 1, receiver 101 may also comprise low-noise amplifier (LNA) 116 in receive signal path 104 after power tap 110 to amplify output signal 120. In some embodiments, loop-control circuitry 114 and detuning circuit 108 may help prevent or inhibit the power level of output signal 120 from exceeding a predetermined peak power level. In some embodiments, the predetermined peak signal or power level may be less than a maximum power level that LNA 116 can handle, although the scope of the invention is not limited in this respect. In some embodiments, LNA 116 may be able to operate at a lower bias current and/or have a higher compression point because LNA 116 does not have to be able handle high power levels at its input. Subsequent mixer and downconverter circuitry with higher compression points may also be used, although the scope of the invention is not limited in this respect.

In some embodiments, receiver 101 may also comprise input filter 118 to filter input signal 119 in receive signal path 104 before power tap 102. Input filter 118 may either be a bandpass or high-pass filter. Receiver 101 may also include other receiver circuitry (ORC) 130 for downconverting and digitizing received signals for use by signal processing circuitry 128.

In some embodiments, transceiver 100 may be part of a mobile handset, such as a third generation (3G) cellular handset. In these embodiments, transceiver 100 may further include duplexer 122 for coupling transmitter 126 and receiver 101 with antenna 124. In some embodiments, a circulator or other coupling element may be used for duplexer 122.

In some embodiments, transceiver 100 may be part of a wireless local area network (WLAN) communication device. In these embodiments, separate transmit and receive antennas may be used. In some of these embodiments, transceiver 100 may transmit and receive orthogonal frequency division multiplexed (OFDM) communication signals. In some of these embodiments, transceiver 100 may be part of a WiFi communication station or WiFi access point, although the scope of the invention is not limited in this respect. In some embodiments, transceiver 100 may be part of a wireless metropolitan area network (WMAN) communication device. In some of these embodiments, transceiver 100 may transmit and receive orthogonal frequency division multiple access (OFDMA) communication signals. In some of these embodiments, transceiver 100 may be part of a WiMax communication station, although the scope of the invention is not limited in this respect. In some of these WiFi and WiMax embodiments, receiver 101 and transmitter 126 may use separate antennas.

In some embodiments, transceiver 100 may be part of an ultra-wide band (UWB) communication device and may transmit and receive ultra-wide band communication signals. Examples of ultra wide band signals may include signals spanning a two to ten gigahertz frequency range, although the scope of the invention is not limited in this respect.

In some embodiments, transceiver 100 may be part of a radio-frequency identification (RFID) tag reader. In these embodiments, transmitter 126 may be coupled to a transmit antenna and receiver 101 may be coupled to a separate receive antenna. In these embodiments, transmitter 126 may generate interrogation signals for transmission by the transmit antenna, and receiver 101 may receive responses to the interrogation signals for use in identifying an interrogated radio-frequency identification tag. In some embodiments, portions of the interrogation signals coupled between the receive and transmit antennas may be attenuated by the detuning circuit 108, although the scope of the invention is not limited in this respect. In these embodiments, signal processing circuitry 128 may generate the interrogation signals and may process the responses received through receive signal path 104 in response to the interrogation signals to determine an identifier of an interrogated radio-frequency identification tag. The response signals may include backscattered and reflected signals to determine an RFID tag's code, although the scope of the invention is not limited in this respect. In some RFID tag reader embodiments, the transmit and receive antennas may each comprise a patch antenna having rectangular dimensions significantly less than half a wavelength of a receive frequency (e.g., 900 MHz).

In some embodiments, transceiver 100 may be a multicarrier transceiver may be part of a wireless communication device that may transmit orthogonal frequency division multiplexed (OFDM) communication signals over a multicarrier communication channel. The multicarrier communication channel may be within a predetermined frequency spectrum and may comprise a plurality of orthogonal subcarriers. In some embodiments, the orthogonal subcarriers may be closely spaced OFDM subcarriers. To help achieve orthogonality between the closely spaced subcarriers, each subcarrier may have a null at substantially a center frequency of the other subcarriers. In some embodiments, to help achieve orthogonality between the closely spaced subcarriers, each subcarrier may have an integer number of cycles within a symbol period, although the scope of the invention is not limited in this respect.

In some embodiments, the frequency spectrums for a multicarrier communication signal may comprise either a 5 GHz frequency spectrum or a 2.4 GHz frequency spectrum. In these embodiments, the 5 GHz frequency spectrum may include frequencies ranging from approximately 4.9 to 5.9 GHz, and the 2.4 GHz spectrum may include frequencies ranging from approximately 2.3 to 2.5 GHz, although the scope of the invention is not limited in this respect, as other frequency spectrums are also equally suitable. In some other embodiments, the frequency spectrum for communications may comprise frequencies between 2 and 11 GHz, although the scope of the invention is not limited in this respect.

In some embodiments, transceiver 100 may transmit and receive RF communications in accordance with specific communication standards, such as the Institute of Electrical and Electronics Engineers (IEEE) standards including IEEE 802.11(a), 802.11(b), 802.11(g), 802.11(h) and/or 802.11 (n) standards for wireless local area networks (WLANs), although transceiver 100 may also be suitable to transmit and/or receive communications in accordance with other techniques including the Digital Video Broadcasting Terrestrial (DVB-T) broadcasting standard, and the High performance radio Local Area Network (HiperLAN) standard. In some broadband and WiMax embodiments, transceiver 100 may transmit and/or recieve broadband wireless communications in accordance with the IEEE 802.16(e) standards for wireless metropolitan area networks (WMANs).

In some embodiments, transceiver 100 may be part of a portable wireless communication device, such as personal digital assistant (PDA), a laptop or portable computer with wireless communication capability, a web tablet, a wireless telephone, a wireless headset, a pager, an instant messaging device, a digital camera, an access point, a television or other device that may receive and/or transmit information wirelessly. In some broadband embodiments, transceiver 100 may be part of a broadband communication station.

Each of the antennas used by transceiver 100, including antenna 124, may comprise a directional or omnidirectional antenna, including, for example, a dipole antenna, a monopole antenna, a patch antenna, a loop antenna, a microstrip antenna or other type of antenna suitable for reception and/or transmission of RF signals by transceiver 100.

Although transceiver 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of transceiver 100 may refer to one or more processes operating on one or more processing elements.

Figure 3:
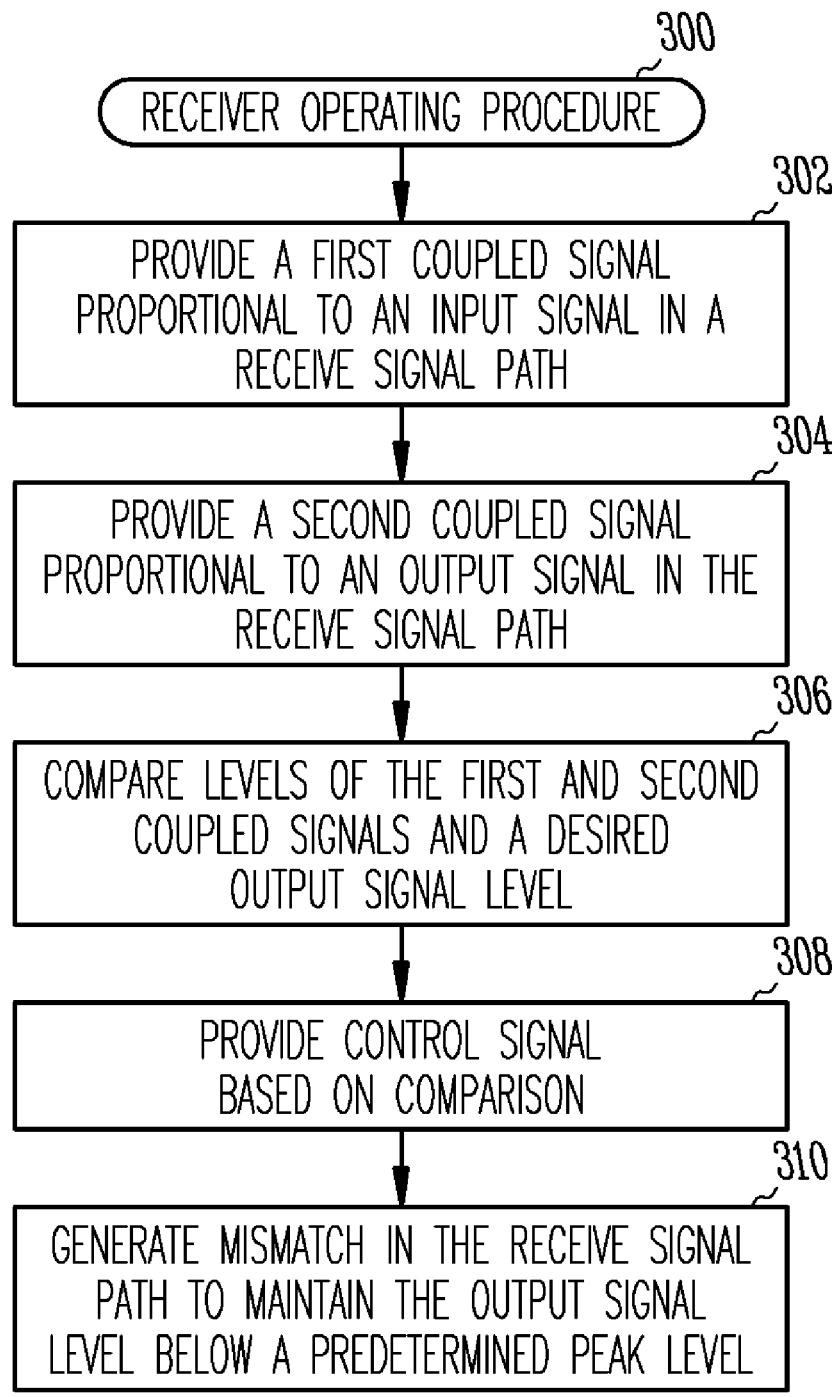
FIG. 3 is a flow chart of a receiver path overload protection operating procedure in accordance with some embodiments of the present invention.

FIG. 3 is a flow chart of a receiver path overload protection operating procedure in accordance with some embodiments of the present invention. Receiver path overload protection operating procedure 300 may be performed by receiver 101 (FIG. 1), although the scope of the invention is not limited in this respect as other receivers may be suitable for performing procedure 300.

Operation 302 comprises providing a first coupled signal proportional to an input signal in a receive signal path. In some embodiments, the first coupled signal may correspond to signal 103 (FIG. 1), the input signal may correspond to input signal 119 (FIG. 1), and the receive signal path may correspond to receive signal path 104 (FIG. 1).

Operation 304 comprises providing a second coupled signal proportional to an output signal in the receive signal path. In some embodiments, the second coupled signal may correspond to signal 111 (FIG. 1), and the output signal may correspond to output signal 120 (FIG. 1).

Operation 306 comprises comparing peak levels of the first and second coupled signals and a desired output signal level. Operation 306 may be performed by loop control circuitry 114 (FIG. 1), peak detector 106 (FIG. 1) may provide the peak level of the first coupled signal, and peak detector 112 (FIG. 1) may provide the peak level of the second coupled signal.

Operation 308 comprises providing a control signal to a detuning circuit based on the comparison performed in operation 306. Operation 308 may be performed by loop control circuitry 114 (FIG. 1) and the control signal may be provided to detuning circuit 108 (FIG. 1). In some embodiments, the control signal may be a gate voltage when the detuning circuit comprises a FET. In other embodiments, the control signal may be used to control one or more varactors and may also be used to switch in one or more shunt resistors depending on the peak signal level of the first coupled signal.

Operation 310 comprises generating an impedance mismatch in the receive signal path in response to the control signal to maintain the output signal level below a predetermined peak level. Operation 310 may be performed by detuning circuit 108 (FIG. 1).

Although the individual operations of procedure 300 are illustrated and described as separate operations, one or more of the individual operations may be performed concurrently, and nothing requires that the operations be performed in the order illustrated.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment. Thus the following claims are hereby incorporated into the detailed description, with each claim standing on its own as a separate preferred embodiment.

What is claimed is:

1. A receiver comprising:
   a detuning circuit to degrade signals in a receive signal path in response to a control signal;
   loop-control circuitry to generate the control signal by a comparison of signal levels in the receive signal path;
   a first peak detector to provide an input signal level output to the loop-control circuitry proportional to a peak level of an input signal in the receive signal path; and
   a second peak detector to provide an output signal level output to the loop-control circuitry proportional to a peak level of an output signal in the receive signal path, wherein the loop-control circuitry is to compare the input signal level output, the output signal level output and a desired output signal level in the receive signal path and is to responsively provide the control signal based on the comparison to maintain the output signal below a predetermined peak signal level.

2. The receiver of claim 1 wherein the detuning circuit is to generate an impedance mismatch in the receive signal path in response to the control signal, and wherein high-power input signal levels in the receive signal path are reflected back to an input of the receiver due to the impedance mismatch.

3. The receiver of claim 2 further comprising:
a first power tap in the receive signal path before the detuning circuit to provide a first coupled signal to the first peak detector proportional to the input signal; and
a second power tap in the receive signal path after the detuning circuit to provide a second coupled signal to the second peak detector proportional to the output signal.

4. The receiver of claim 2 wherein the loop-control circuitry comprises a proportional-integral-derivative controller.

5. The receiver of claim 2 wherein the detuning circuit comprises a field-effect transistor and wherein the control signal comprises a gate voltage.

6. The receiver of claim 2 wherein the detuning circuit comprises:
one or more varactors responsive to the control signal to generate the impedance mismatch;
one or more shunt resistors; and
switching circuitry responsive to the control signal to switch the one or more shunt resistors into the receive signal path, the one or more shunt resistors to attenuate high level input signals when the input signal level output exceeds a predetermined level.

7. A transceiver comprising:
a transmitter to generate signals for transmission; and
a receiver comprising:
a detuning circuit to degrade signals in a receive signal path in response to a control signal;
loop-control circuitry to generate the control signal by a comparison of signal levels in the receive signal path;
a first peak detector to provide an input signal level output to the loop-control circuitry proportional to a peak level of an input signal in the receive signal path; and
a second peak detector to provide an output signal level output to the loop-control circuitry proportional to a peak level of an output signal in the receive signal path,
wherein the loop-control circuitry is to compare the input signal level output, the output signal level output and a desired output signal level in the receive signal path and is to responsively provide the control signal based on the comparison to maintain the output signal below a predetermined peak signal level.

8. The transceiver of claim 7 wherein the detuning circuit is to generate an impedance mismatch in the receive signal path in response to the control signal, and
wherein high-power input signal levels in the receive signal path are reflected back to an input of the receiver due to the impedance mismatch.

9. The transceiver of claim 8 further comprising a duplexer for coupling the transmitter and the receiver with an antenna, wherein the transceiver is part of a mobile handset.

10. The transceiver of claim 8 wherein the transceiver is to transmit and receive orthogonal frequency division multiplexed signals and is part of a wireless local area network communication station.

11. The transceiver of claim 8 wherein the transceiver is to transmit and receive orthogonal frequency division multiplex access signals and is part of a wireless broadband network communication station.

12. The transceiver of claim 8 wherein the transceiver is part of an ultra-wide band communication device and is to transmit and receive ultra-wide band communication signals.

13. The transceiver of claim 8 wherein the transceiver is part of a radio-frequency identification tag reader, the transmitter is coupled to a transmit antenna, and the receiver is coupled to a receive antenna,
wherein the receiver is to receive responses to interrogation signals for use in identifying an interrogated radio-frequency identification tag,
wherein the transceiver further comprises signal processing circuitry to generate the interrogation signals for transmission by the transmitter through the transmit antenna and to process the responses received through the receive signal path in response to the interrogation signals to determine an identifier of the interrogated radio-frequency identification tag.

14. A method of operating a receiver comprising:
comparing signal levels in a receive signal path;
responsively generating an impedance mismatch in the receive signal path based on the signal levels to reflect high-power input signal levels in the receive signal path back to an input of the receiver;
providing an input signal level output proportional to a peak level of an input signal in the receive signal path; and
providing an output signal level output proportional to a peak level of an output signal in the receive signal path,
wherein the comparing comprises comparing the input signal level output, the output signal level output and a desired output signal level in the receive signal path and
wherein the method includes responsively providing a control signal to generate the impedance mismatch based on the comparison to maintain the output signal below a predetermined peak signal level.

15. The method of claim 14 wherein the comparing is performed by a proportional-integral-derivative controller.

16. The method of claim 14 wherein generating an impedance mismatch comprises providing a gate voltage to a field-effect transistor.

17. The method of claim 14 wherein generating an impedance mismatch comprises providing the control signal to one or more varactors to generate the impedance mismatch.

18. The method of claim 17 further comprising switching one or more shunt resistors into the receive signal path, the one or more shunt resistors to attenuate higher-level input signals when the input signal level output exceeds a predetermined level.

19. A system comprising:
the receiver; and
at least one omnidirectional antenna coupled to the receiver,
wherein the receiver comprises:
a detuning circuit to generate an impedance mismatch in a receive signal path in response to a control signal;
loop-control circuitry to generate the control signal by a comparison of signal levels in the receive signal path, wherein high-power input signal levels in the receive signal path are reflected back to an input of the receiver due to the impedance mismatch;
a first peak detector to provide an input signal level output to the loop-control circuitry proportional to a peak level of an input signal in the receive signal path; and a second peak detector to provide an output signal level output to the loop-control circuitry proportional to a peak level of an output signal in the receive signal path, wherein the loop-control circuitry is to compare the input signal level output, the output signal level output and a desired output signal level in the receive signal path and is to responsively provide the control signal based on the comparison to maintain the output signal below a predetermined peak signal level.

20. The system of claim 19 wherein the detuning circuit comprises a field-effect transistor and wherein the control signal comprises a gate voltage.

21. The system of claim 19 wherein the detuning circuit comprises:
one or more varactors responsive to the control signal to generate the impedance mismatch;
one or more shunt resistors; and
switching circuitry responsive to the control signal to switch the one or more shunt resistors into the receive signal path, the one or more shunt resistors to attenuate high level input signals when the input signal level output exceeds a predetermined level.

* * * * *

UNITED STATES PATENT AND TRADEMARK OFFICE
CERTIFICATE OF CORRECTION

PATENT NO. : 7,409,197 B2
APPLICATION NO. : 11/096195
DATED : August 5, 2008
INVENTOR(S) : Posamentier It is certified that error appears in the above-identified patent and that said Letters Patent is hereby corrected as shown below:

On the title page, in item (74), in "Attorney, Agent, or Firm" in column 2, line 1, delete "Lunderg" and insert -- Lundberg --, therefor.

Signed and Sealed this

Fourteenth Day of October, 2008

JON W. DUDAS
*Director of the United States Patent and Trademark Office*